United States Patent
Chen et al.

(10) Patent No.: US 7,921,339 B2
(45) Date of Patent: Apr. 5, 2011

(54) FLASH STORAGE DEVICE WITH DATA CORRECTION FUNCTION

(75) Inventors: Ming-Dar Chen, Hsinchu (TW); Chuan-Sheng Lin, Jhubei (TW); Hsiang-An Hsieh, Sijhih (TW)

(73) Assignee: A-Data Technology Co., Ltd., Taipei (TW)

( * ) Notice: Subject to any disclaimer, the term of this patent is extended or adjusted under 35 U.S.C. 154(b) by 282 days.

(21) Appl. No.: 12/232,124

(22) Filed: Sep. 11, 2008

(65) Prior Publication Data
US 2009/0307537 A1   Dec. 10, 2009

(30) Foreign Application Priority Data
Jun. 4, 2008   (TW) ................................ 97120721 A

(51) Int. Cl.
*G06F 11/00*   (2006.01)
(52) U.S. Cl. ............... 714/54; 711/103; 714/6; 714/43; 714/746; 714/758
(58) Field of Classification Search ................ 714/6, 43, 714/54, 746, 758; 711/103
See application file for complete search history.

(56) References Cited

U.S. PATENT DOCUMENTS

| | | | |
|---|---|---|---|
| 2002/0085419 A1* | 7/2002 | Kwon et al. ............ | 365/185.17 |
| 2005/0169057 A1* | 8/2005 | Shibata et al. ........... | 365/185.28 |
| 2006/0064537 A1* | 3/2006 | Oshima ..................... | 711/103 |
| 2007/0253250 A1* | 11/2007 | Shibata et al. ........... | 365/185.03 |
| 2008/0055989 A1* | 3/2008 | Lee et al. ................. | 365/185.09 |
| 2008/0127104 A1* | 5/2008 | Li et al. .................... | 717/126 |
| 2009/0125671 A1* | 5/2009 | Flynn et al. .............. | 711/103 |

OTHER PUBLICATIONS

Gregori, "On-Chip error correction techniques for new generation flash memories", Apr. 2003, pp. 602-616.*

* cited by examiner

*Primary Examiner* — Robert Beausoliel
*Assistant Examiner* — Jeison C Arcos
(74) *Attorney, Agent, or Firm* — Rosenberg, Klein & Lee

(57) ABSTRACT

A flash controller performs a data correction function while executing a copy back procedure for a flash memory, and the flash memory includes at least one memory unit and a page buffer. The flash controller contains: a transmission buffer, an error correction unit, a correction information register, and a microprocessor. The microprocessor reads out a data from, the page buffer and stores the data into the transmission buffer after producing a read instruction of page copy to the flash memory. The microprocessor controls the error correction unit to check and correct the data in the transmission buffer and calculate a check result. The microprocessor produces a different program command to record the corrected data into the memory unit according to the data error quantity of the check result. Thereby, the present invention can achieve the purpose of improving the flash controller in reliability and access efficiency.

10 Claims, 2 Drawing Sheets

FLASH STORAGE DEVICE WITH DATA CORRECTION FUNCTION

BACKGROUND OF THE INVENTION

1. Field of the Invention

The present invention is related to a flash storage device, and more particular to a flash storage device that is able to correct data when performing copy back instruction and operation on the flash memory.

2. Description of Related Art

In recent years, since NAND flash provides advantages of low production cost, fast read/write speed, reduced energy consumption, and high reliability, it has been widely applied in consumer electronic products for use in storage media.

Due to the fact that the operations for unit capacity read/write and unit capacity erase in NAND flash are essentially different, therefore a special approach (generally referred as Flash File System (FFS)) is required to allocate and manage the storage space in NAND flash. Herein the unit capacity read/write uses "page", while the unit capacity erase is based on "block"; also, block are bigger in capacity, usually consisting of 32 or 64 pages. Additionally, upon data update, NAND flash needs to be erased before being written in new data; hence, when only part of the data within a block needs to be simultaneously updated, it is necessary to copy the remaining part of the data that is not undergoing update and still valid, so as to move the valid data onto a erased block.

In order to increase the speed of copying data from a source memory block to a target memory block in NAND flash, NAND flash will provide new instructions and communication protocols, thereby allowing the data originally recorded in a memory unit in NAND flash to be first read (i.e. retrieved) into a page buffer in NAND flash, therefore without transferring the data to controllers located outside NAND flash, it is possible to send the data back to other positions of memory unit in NAND flash. That is, it is possible to first execute the Read Page instruction, then the Write Page instruction (commonly referred as the Program instruction), so as to directly record the data held in the page buffer back to other positions of memory units in NAND flash, and each time a page of data can be directly copied. Therein, such instructions and communication protocols are known as Copy Back instruction and operation.

Due to limited reliability on data retention of the memory units in NAND flash, NAND flash manufacturers usually propose a recommended strength regarding the adopted Error Correction Code (ECC) in their specifications. For example, if the suggested ECC strength is 1 bit/512 Byte, then it indicates that if an error occurs in one (1) bit out of 512 bytes of data, it can be detected and corrected.

It should be noted that under certain conditions a problem might occur, such as when a controller performs copy back operation on NAND flash. Since the data recorded in the memory unit is not transferred outside of the NAND flash, i.e. error check is not performed by the controller; then as a result, suppose an error does occur in the data originally recorded in NAND flash and that the data is copied to other positions through the copy back instruction, so now erroneous data will be copied directly from the source page to the new target page, without going through the error detection and correction procedure.

In order to overcome this problem, prior art technology has proposed that after the completion of copy back operation, the controller furthermore reads the data already copied in the new target page through the read page instruction, so as to perform ECC check and verify the correctiveness of such data. Also, in case the occurrence of data error is detected, then abandon the copied data and execute correction process.

However, although this well-known prior art practice can locate errors in data and then perform the necessary corrections after the completion of copy back operation, but because the data has been copied from the source page to the target page, so that the erroneous data now occupies the target page. Therefore, the prior art requires copying all the valid data in the target page again to move the valid data onto other blocks, and erase the target block that holds the erroneous data. As a result, when data errors did occur, there will be extra time delays and correction operations, which will seriously affect the effect and objective of using copy back process to improve the speed for data write and update.

To resolve this issue, the industry has currently proposed a new controller operation mode, so that during the operation of copy back, after reading the data in the memory unit of NAND flash and placing it into the page buffer in NAND flash, the controller may first read the data located in the page buffer then check its correctiveness; and when an error is detected, it performs correction operations on the erroneous data in the page buffer, and then "programs" (i.e. copy) the corrected data to a new position in the memory unit.

However, even though the aforementioned prior art operation process can correct the errors within the source data, ensures that the copy back operation can program the correct data to the new position; but when the prior art operation process finds errors and corrects them, it is required to detect the positions where data errors occur by the controller via ECC check code, and correct these errors one by one. The positions where the errors occur are not necessarily continuous, so it needs to complete the corrections of data errors in the page buffer by inputting instruction, data address, and correct data in a one-by-one approach. Therefore, in a situation where data errors are many, the prior art operation process needs significantly so much process time, that the objective of operation time reduction can not be achieved effectively.

SUMMARY OF THE INVENTION

In view of the aforementioned issues, the technical problems addressed by the present invention are: by means of improvement in NAND flash controller, modification is made to the procedure of copy back instruction and the operation executed by the NAND flash controller onto the flash memory. Thereby, the present invention may select different ways to process depending on whether error has occurred or not in the data contents of the source page, as well as depending on the number of errors occurred therein, thereby further achieving the objectives of ensuring the reliability of data storage in the flash memory and accelerating the access speed of the flash memory controller.

To achieve the objectives described above according to the present invention, a flash memory controller with data correction function is provided, which executes the data correction function when a flash memory performs a copy back procedure, wherein the flash memory includes at least a memory unit and a page buffer, and the flash memory controller comprises: a transmission buffer, an error correction unit, a correction information register, and a microprocessor. Therein the transmission buffer is used to register the information that the page buffer accesses; the error correction unit is connected to the transmission buffer for checking and correcting the data in the transmission buffer based on an Error Check Code (ECC) and thereby generating a check result. The correction information register is connected to the error correction unit for registering the check result. Finally, the microprocessor, after generating a read instruction for page copy to the flash memory, stores the data in the page buffer to the transmission buffer, then controls the error correction unit and the correction information register to operate, at which point the microprocessor further generates a corresponding program instruction based on the number of data errors in the check result, so as to program the checked/corrected data into the memory unit.

In order to achieve the above-mentioned objectives the present invention provides a method for data correction of the flash controller, which is applied in the execution of a copy back procedure to a flash memory, in which the flash memory includes at least a memory unit and a page buffer, and the method for data correction comprises the following steps: initially, generating a read instruction for page copy to the flash memory, and reading (i.e. retrieving) the data in the page buffer to a transmission buffer; then, checking and correcting the data in the transmission buffer, thus acquiring a check result; next, further generating a different program instruction based on the number of data errors in the check result, so as to program the checked/corrected data into the memory unit.

The summary described above, as well as subsequent detailed descriptions and appended drawings are all for further illustrating the approaches, means, and effects taken by the present invention for achieving the prescribed objectives. Other purposes and advantages related with the present invention will be explained in the following descriptions and appended drawings.

DETAILED DESCRIPTION OF PREFERRED EMBODIMENTS

The present invention proposes a flash controller with data correction function and a data correction method thereof, which modifies the Copy Back procedure executed by the flash controller to the flash memory. Therein, the flash controller may select different ways to process depending on whether error has occurred or not in the data contents of the source page, as well as depending on the number of errors occurred therein, thereby further achieving the objectives of ensuring the reliability of data storage in the flash memory and accelerating the access speed of the flash memory controller. The operational principles of the copy back procedure are well-known to those skilled in the art; therefore no further illustrations will be explained in the descriptions of the following embodiments.

Figure 1:
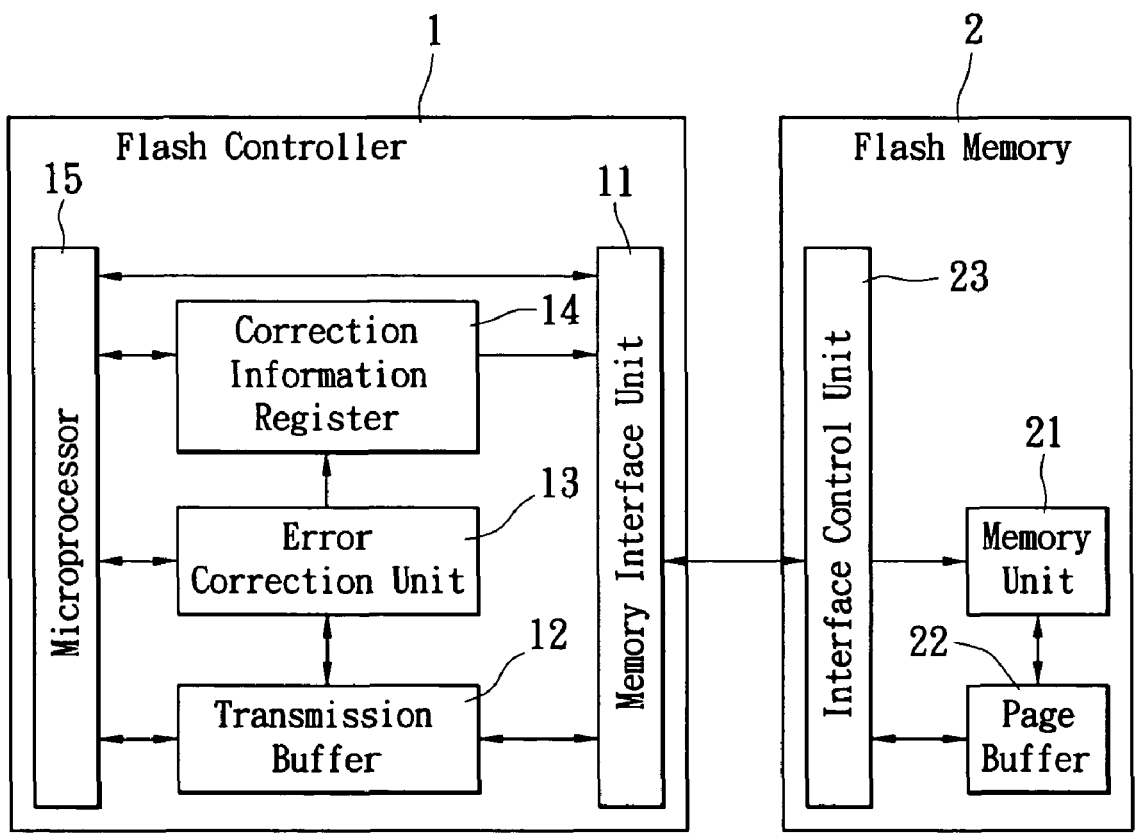
FIG. 1 is a schematic block diagram for an embodiment of the flash controller with data correction function according to the present invention.

Please refer to FIG. 1, which shows a schematic block diagram for an embodiment of the flash controller with data correction function according to the present invention. As illustrated, the present embodiment provides a flash controller 1 with data correction function, and as an example can be applied to application devices with independent functions that uses a flash memory 2 as storage media (e.g. a multimedia device, a Personal Digital Assistant (PDA), a mobile phone, a notebook computer, an industrial computer, a POS machine, and the like); the flash controller 1 may, as an example, also be applied to a storage device that uses flash memory 2 as storage media (e.g. a solid state disk (SSD), a portable disk drive, or a memory card, etc.). In addition, the flash controller 1 may also perform data correction functions when executing a copy back procedure on the flash memory 2.

Therein, as an example, the flash memory 2 may be NAND flash, which is currently the most commonly used flash memory. The flash memory 2, which supports the copy back procedure, includes as least a memory unit 21, a page buffer 22, and an interface control unit 23. Therein the memory unit 21 is used to store user-saved data; the page buffer 22 is used to store page data read (i.e. retrieved) from the memory unit 21. Furthermore, in the course of programming, the page buffer 22 is used to store the data about to be programmed (i.e. copied) into the memory unit 21. The interface control unit 23 acts as an external connection interface for the flash memory 2, and controls the operations of the memory unit 21 and the page buffer 22.

The flash controller 1 according to the present invention comprises: a memory interface unit 11, a transmission buffer 12, an error correction unit 13, a correction information register 14, and a microprocessor 15. Therein the memory interface unit 11 connects to the interface control unit 23 of the flash memory 2, and receives control from the microprocessor 15 to act as the interface for accessing the flash memory 2.

The transmission buffer 12 is connected to the memory interface unit 11 for registering the data retrieved from the page buffer 22 of the flash memory 2. In practical operation, when some data in the memory unit 21 of the flash memory 2 needs to be updated, then the flash controller 1 performs the copy back procedure to the flash memory 2, so that the valid data stored in the memory unit 21 that is to be updated will be stored in the page buffer 22. Before program the valid data from the page buffer 22 back to a target page in the memory unit 21, the flash controller 1 is retrieve the data from the page buffer 22 and store the data in the transmission buffer 12 for checking the data correctness.

The error correction unit 13 is connected to the transmission buffer 12. Therein, the error correction unit 13 is used to check and correct the data stored in the transmission buffer 12 based on an Error Check Code (ECC), and then accordingly generates a check result. Therein, for example, the check result can be the number of data errors, positions of data errors, correction data, and corresponding correction instructions, etc. The correction information register 14 is connected to the error correction unit 13. Therein, the correction information register 14 is used to register the check result and provides the check result to the microprocessor 15 for further process. Additionally, in terms of the data in the transmission buffer 12, only after actual checks and corrections can the error correction unit 13 obtain the real/actual number of data errors.

The microprocessor 15, after generating a read instruction for page copy by executing the copy back procedure on the flash memory 2, will read the data in the page buffer 22 through the memory interface unit 11 and register the data to the transmission buffer 12. At this time the microprocessor 15 controls the operations of the error correction unit 13 and the correction information register 14, so as to further generate a different program instruction based on the number of data errors in the check result, thereby programming the checked/corrected data in a target page in the memory unit 21 to complete the so-called data update.

For further illustration, in practical design the microprocessor 15 further uses a first threshold and a second threshold to determine the number of data errors for generating different program instructions.

Therein, by design the first threshold is specified according to the difference between an error correction capability value of the ECC in the error correction unit 13 and a factory suggested correction value of the flash memory 2. For example, if the factory specification of the flash memory 2 suggests the use of ECC of 1 bit/512 byte, and the correction capability value of the ECC adopted in the error correction unit 13 is 4 bit/512 byte, then the first threshold is 3 bit/512 byte. In other words, this threshold indicates the allowance of 3 bits of error occurring for every 512 bytes of data in the source page of the memory unit 21, which are directly neglected without correction. For another example, suppose the factory specification of the flash memory 2 suggests the use of ECC of 8 bit/512 byte, and the correction capability value of the ECC adopted in the error correction unit 13 is 12 bit/512 byte, then the first threshold is now 4 bit/512 byte, and this threshold indicates the allowance of 4 bits of error occurring for every 512 bytes of data in the source page of the memory unit 21, which are directly neglected without correction.

The second threshold is expressed according to a quotient value. Therein the quotient value is generated by an X value divided by a Y value; wherein the X value is the required time for transferring the page data in the transmission buffer 12 by the microprocessor 15 into the page buffer 22, and the Y value is the required time for directly correcting a data by the microprocessor 15 to the page buffer 22. For instance, if the time for directly correcting an erroneous data by the microprocessor 15 to the page buffer 22 is 10 microseconds ($\mu s$) (since for each correction of erroneous data, the microprocessor 15 requires to first re-transfer control instruction and position of the erroneous data, then inputs corrected data, therefore the required time is more lengthy); but the required time for transferring the page data in the transmission buffer 12 by the microprocessor 15 into the page buffer 22 is 100 $\mu s$. Therefore the second threshold will be 100/10=10; that is, when the number of data errors exceeds 10, then it exceeds the second threshold. In other word, when the number of data errors exceeds the second threshold, for example 11 errors, which exceeds 10; then the required time for transferring the page data in the transmission buffer 12 through the page buffer 22 (i.e. the X value, in this example 100 $\mu s$) is shorter than the required time for directly performing data correction one by one to the page buffer 22 (i.e. one by one correction time is 10 $\mu s$*11=110 $\mu s$ and may be referred to as the Z value, and 100 $\mu s$ is shorter than 110 $\mu s$). Contrarily, if the number of data errors is smaller than the second threshold, for example 9 errors; then the required time for transferring the page data in the transmission buffer 12 through the page buffer 22 (i.e. the X value, in this example 100 $\mu s$) is slower than the required time for directly performing data correction one by one to the page buffer 22 (i.e. one by one correction time is the Z value and is 10 $\mu s$*9=90 $\mu s$, and 100 $\mu s$ is slower than 90 $\mu s$).

As a result, after the determination on the number of data errors by the microprocessor 15 using the first and second thresholds, the possible resultant conditions is as below: first condition, when the microprocessor 15 determines that the number of data errors is smaller than or equal to the first threshold, it indicates that the data read from the page buffer 22 is completely correct or has an allowable number of errors which can be directly neglected. Therefore, the microprocessor 15 directly generates the program instruction for page copy to appoint the position of target page in the memory unit 21, and further executes a start programming instruction so as to directly program the data not in need of correction in the page buffer 22 into the target page of the memory unit 21.

Second condition, when the microprocessor 15 determines that the number of data errors is greater than the first threshold but smaller than the second threshold, it indicates two things; one, the number of data errors may not be neglected; and two, the required time for transferring the page data in the transmission buffer 12 through the page buffer 22 is longer than the required time for directly performing data correction one by one to the page buffer 22 (i.e. the X value is greater than the Z value). Consequently, the microprocessor 15 will directly generate the program instruction for page copy to appoint the position of target page in the memory unit 21, and further issues a correction instruction, a position of correction instruction, and a correction data input to correct the data in the page buffer 22 one by one. Then the microprocessor 15 generates the start programming instruction so as to program the corrected data in the page buffer 22 into the position of the target page in the memory unit 21.

Third condition, when the microprocessor 15 determines that the number of data errors is greater than the second threshold, and falls within the error correction capability value of the error correction unit 13, it similarly indicates two things; one, the number of data errors may not be neglected; and two, the required time for transferring the page data in the transmission buffer 12 through the page buffer 22 is shorter than the required time for directly performing data correction one by one to the page buffer 22 (i.e. the X value is less than the Z value). Consequently, the microprocessor 15 generates a basic program instruction to appoint the position of target page in the memory unit 21, which transfers the corrected data in the transmission buffer 12 into the page buffer 22, and further generates the start programming instruction so as to program the corrected data in the page buffer 22 into the position of target page in the memory unit 21.

Certainly, there exists a fourth condition as well; when the microprocessor 15 determines the number of data errors is greater than the second threshold, and also exceeds the error correction capability value of the error correction unit 13, this indicates the error correction unit 13 is not able to correct the erroneous data based on the ECC. In other words, at this time it is not possible to guarantee the copying of correct data into the position within the target page. Therefore, the microprocessor 15 may alternatively execute an error process procedure, which may include operations to return the error code and to specify the bad block, and the error process procedure would then terminate the copy back procedure. However, this situation is by no means used to restrict the data correction function of the present invention, but is merely shown as a possible way that allows the flash controller 1 to be able to deal with various possible conditions.

Via the corresponding response to the above described four conditions, the flash controller 1 can automatically select different approaches to process depending on whether error has occurred or not in the data contents of the source page, as well as depending on the number of errors occurred therein, thereby allowing the flash controller 1 to maintain the access speed to a certain extent when various situations occur.

Figure 2:
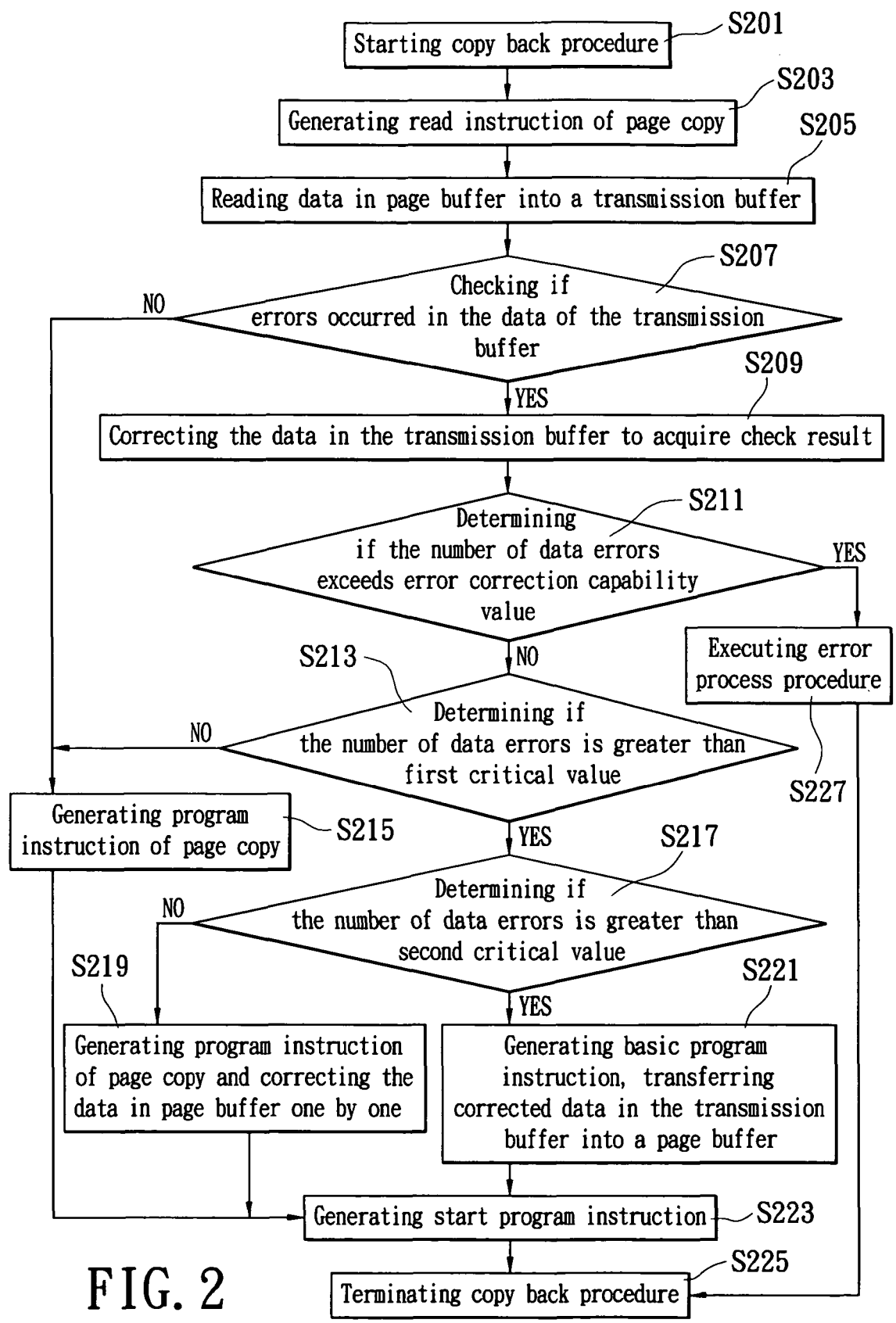
FIG. 2 is a flowchart for a data correction method of the flash controller according to the present invention.

To further describe the detailed operation process of the present invention, please refer to FIG. 2. Therein a flowchart for the data correction method of the flash controller according to the present invention embodiment is shown. As illustrated, the present embodiment provides a data correction method for the flash controller 1, which comprises the following steps: initially, upon the occurrence of data update in the memory unit 21 of the flash memory 2, the flash controller 1 starts to perform a copy back procedure onto the flash memory 2 (S201), and generates a read instruction of page copy (S203), thereby allowing the page buffer 22 in the flash memory 2 to store the data retrieved from the source page in the memory unit 21.

Next, the flash controller 1 reads (i.e. retrieves) the data in the page buffer 22 to a page buffer 22 (S205), and then checks whether error has occurred or not in the data of the transmission buffer 12 (S207). If the data error has been detected in the data of the transmission buffer 12, then the flash controller 1 try to correct the error in the data of the transmission buffer 12 (i.e. corrected according to an error check code (ECC)) so as to acquire a check result (S209), and then determines whether the number of data errors in the check result exceeds the error correction capability value of the flash controller 1 or not (S211).

If the determination in step (S211) is negative, which indicates the flash controller 1 is able to perform the action of data correction, then further determines whether the number of data errors exceeds a first threshold (S213). At this moment, suppose the number of data errors is smaller than the first threshold (i.e. the First Condition), which indicates allowable number of data errors occurred in the read data of the page buffer 22 and may be directly neglected. As a result, the flash controller 1 directly generates a program instruction of page copy to appoint the position in the target page of the memory unit 21 (S215), and indicates that it is possible to directly program the uncorrected data in the page buffer 22 into the memory unit 21. Similarly, when the check result obtained in step (S207) is negative, indicating the read data in the page buffer 22 is completely correct, then it may directly execute step (S215) to generate the program instruction of page copy without correction.

Alternatively, if the determination in step (S213) is yes, then further determine whether the number of data errors exceeds a second threshold or not (S217). At this time, suppose the determination in step (S217) is no (i.e. the Second Condition), which means the number of data errors should not be neglected, and the required time for transferring the page data in the transmission buffer 12 into the page buffer 22 is longer than the required time for directly performing data correction one by one to the page buffer 22 (i.e. the X value is greater than the Z value). Consequently, the flash controller 1 directly generates the program instruction of page copy to appoint the position of the target page in the memory unit 21, and further based on the check result issues a correction instruction, a position of correction instruction, and a correction data input to correct the data in the page buffer 22 one by one (S219).

If the determination in step (S217) is positive (i.e. the Third Condition), it means the number of data errors similarly should not be neglected, and the required time for transferring the page data in the transmission buffer 12 into the page buffer 22 is shorter than the required time for directly performing data correction one by one in the page buffer 22 (i.e. the X value is less than the Z value). Therefore, the flash controller 1 generates a basic program instruction to appoint the position of the target page in the memory unit 21, and furthermore transfers the corrected data in the transmission buffer 12 into the page buffer 22 (S221).

After steps (S215), (S219), or (S221), the flash controller 1 will actually generate a start programming instruction (S223) so as to program the data in the page buffer 22 according to the position of the target page appointed in the above-mentioned steps. In this way, the data update to the memory unit 21 can be completed and the copy back procedure ends (S225).

Finally, if the determination in step (S211) decides that the number of data errors exceeds the error correction capability value of the flash controller 1, which indicates that the flash controller 1 is not able to correct the erroneous data therein, and that it is not possible to copy correct data to the position in the target page. As a result, the flash controller 1 executes an error process procedure (S227) and directly terminates the copy back procedure.

In summary, the present invention is to modify the copy back procedure executed by the flash controller to the flash memory. Thereby it is possible to increase the performance when the flash controller executing the copy back procedure, saving time and ensuring the correctiveness of data copy. In addition, it is especially important that the present invention can select a better approach to process depending on whether error has occurred or not in the data contents of the source page, as well as depending on the number of errors occurred therein, which effectively improves the reliability of data storage in flash memory and access speed thereon.

The illustrations described above simply set out the detailed descriptions and appended drawings for embodiments of the present invention, which are by no means used to limit the present invention thereto. The scope of the present invention should be defined by the following claims, and all changes or modifications that any one skilled in the relevant arts can conveniently consider within the field of the present invention are deemed to be encompassed by the scope of the present invention.

What is claimed is:

1. A flash storage device with data correction function, comprising:
   a flash memory, which includes at least a memory unit and a page buffer;
   a transmission buffer, which is used to register the information that the page buffer accesses;
   an error correction unit, connected to the transmission buffer, for checking and correcting the data in the transmission buffer based on an Error Check Code (ECC) and for generating a check result;
   a correction information register, connected to the error correction unit, for registering the check result; and
   a microprocessor, wherein the microprocessor, after generating a read instruction for page copy to the flash memory, reads the data in the page buffer and stores the data to the transmission buffer, and controls the error correction unit and the correction information register to operate, and furthermore generates a corresponding program instruction based on the number of data errors determined via a first threshold and a second threshold in the check result to program a corrected data into the memory unit, wherein the microprocessor further uses a first threshold and a second threshold to determine the number of data errors to generate a corresponding program instruction.

2. The flash storage device with data correction function according to claim 1, wherein the flash memory is a NAND flash.

3. The flash storage device with data correction function according to claim 1, wherein the first threshold is designed based on a difference between an error correction capability value of the error correction unit and a suggested correction value of the flash memory, and the second threshold is designed based on a quotient of a required time for transferring the page data in the transmission buffer into the page buffer divided by a required time for directly correcting a data by the microprocessor in the page buffer.

4. The flash storage device with data correction function according to claim 1, wherein, when the number of data errors is greater than the first threshold but smaller than the second threshold, the microprocessor corrects the data in the page buffer based on the check result one by one, and further programs the corrected data in the page buffer into the memory unit.

5. The flash storage device with data correction function according to claim 4, wherein, when the number of data errors is greater than the second threshold and falls within the error correction capability value of the error correction unit, the microprocessor transfers the corrected data in the transmission buffer into the page buffer, and further programs said corrected data into the memory unit.

6. The flash storage device with data correction function according to claim 5, wherein, when the number of data errors is smaller than or equal to the first threshold, the microprocessor directly programs the data in the page buffer into the memory unit.

7. The flash storage device with data correction function according to claim 1, further comprising:
 a memory interface unit, connected to the flash memory, for receiving the control from the microprocessor to access the flash memory; and
 an interface control unit, connected to the memory interface unit, in order to control the memory unit and the page buffer.

8. The flash storage device with data correction function according to claim 1, wherein the steps of the data correction function comprise:
 reading the data in the page buffer to the transmission buffer;
 checking and correcting the data in the transmission buffer, and acquiring a check result; and
 generating a corresponding program instruction based on the number of data errors in the check result.

9. The flash storage device with data correction function according to claim 8, wherein, after the step of acquiring the check result, further determining whether the number of data errors exceeds an error correction capability value of the flash controller or not, and if the error correction capability value has been exceeded, then executing an error process procedure and terminating the copy back procedure.

10. The flash storage device with data correction function according to claim 8, wherein, after the step of generating the corresponding program instruction based on the number of data errors in the check result, further program the corresponding data into the memory unit.

* * * * *